(12) United States Patent
Reinart

(10) Patent No.: US 10,459,821 B2
(45) Date of Patent: Oct. 29, 2019

(54) DYNAMICALLY CONTROLLING ERASURE CODE DISTRIBUTION IN AN OBJECT STORE

(71) Applicant: Quantum Corporation, San Jose, CA (US)

(72) Inventor: John Reinart, Roseville, MN (US)

(73) Assignee: Quantum Corporation, San Jose, CA (US)

( * ) Notice: Subject to any disclaimer, the term of this patent is extended or adjusted under 35 U.S.C. 154(b) by 102 days.

(21) Appl. No.: 15/631,486

(22) Filed: Jun. 23, 2017

(65) Prior Publication Data

US 2017/0288702 A1 Oct. 5, 2017

Related U.S. Application Data

(62) Division of application No. 14/183,310, filed on Feb. 18, 2014, now Pat. No. 9,727,437.

(51) Int. Cl.
*G06F 11/34* (2006.01)
*H03M 13/37* (2006.01)
(Continued)

(52) U.S. Cl.
CPC ...... *G06F 11/3466* (2013.01); *G06F 11/1076* (2013.01); *H03M 13/154* (2013.01);
(Continued)

(58) Field of Classification Search
CPC ............................ G06F 3/064; G06F 11/3466
See application file for complete search history.

(56) References Cited

U.S. PATENT DOCUMENTS 6,971,092 B1 11/2005 Chilimbi
2010/0115063 A1* 5/2010 Gladwin ............. H04L 67/1097
709/219

(Continued)

OTHER PUBLICATIONS

T. Fujie, K. Kuno, J. Takahashi, H. Tode, T. Masaki and K. Murakami, "Multi-server content distribution scheme using erasure codes," Local Computer Networks, 2004. 29th Annual IEEE International Conference on, 2004, pp. 415-416.
(Continued)

Primary Examiner — Steve N Nguyen
(74) Attorney, Agent, or Firm — Eschweiler & Potashnik, LLC

(57) ABSTRACT

Example apparatus and methods monitor conditions in an object storage system. The conditions monitored may include a load balance measure in the system, a capacity balance measure in the system, a fault tolerance measure in the system, or a usage pattern measure in the system. A distribution plan or redistribution plan for storing or moving erasure codes in the object storage system may be determined based on the conditions. The distribution plan or the redistribution plan for the erasure codes may be updated dynamically in response to changing conditions in the object storage system. The distribution or redistribution may depend on a weighted combination of the load balance measure, the capacity balance measure, the fault tolerance measure, or the usage pattern measure so that responding to one sub-optimal condition (e.g., load imbalance) does not create a different sub-optimal condition (e.g., unacceptable fault tolerance).

13 Claims, 10 Drawing Sheets

(51) Int. Cl.
  *G06F 11/10* (2006.01)
  *H03M 13/15* (2006.01)
  *G06F 3/06* (2006.01)
(52) U.S. Cl.
  CPC ..... *H03M 13/373* (2013.01); *H03M 13/3761* (2013.01); *G06F 3/064* (2013.01)

(56) References Cited

U.S. PATENT DOCUMENTS

| | | | | |
|---|---|---|---|---|
| 2011/0029742 A1* | 2/2011 | Grube | ................... | G06F 9/4401 |
| | | | | 711/154 |
| 2011/0122523 A1* | 5/2011 | Gladwin | ............ | G11B 20/1252 |
| | | | | 360/49 |
| 2011/0185258 A1* | 7/2011 | Grube | ................... | G06F 16/182 |
| | | | | 714/763 |
| 2013/0198756 A1* | 8/2013 | Grube | ................ | G06F 11/2094 |
| | | | | 718/104 |
| 2014/0075112 A1* | 3/2014 | Baptist | ................. | G06F 3/0689 |
| | | | | 711/114 |

OTHER PUBLICATIONS

Non-Final Office Action dated Jun. 7, 2016 for U.S. Appl. No. 14/183,310.
Final Office Action dated Sep. 7, 2016 for U.S. Appl. No. 14/183,310.
Non-Final Office Action dated Dec. 23, 2016 for U.S. Appl. No. 14/183,310.
Notice of Allowance dated Apr. 7, 2017 for U.S. Appl. No. 14/183,310.

* cited by examiner

DYNAMICALLY CONTROLLING ERASURE CODE DISTRIBUTION IN AN OBJECT STORE

REFERENCE TO RELATED APPLICATION

This Application is a Divisional of U.S. application Ser. No. 14/183,310 filed on Feb. 18, 2014, the contents of which are hereby incorporated by reference in their entirety.

BACKGROUND

Object stores may store objects using erasure codes. An object store, which may also be referred to as an object based storage system, may have multiple devices (e.g., disks) in multiple apparatus (e.g., servers) positioned at multiple locations (e.g., sites). An object store may be controlled with respect to where any given erasure code is stored or with respect to where any given collection of erasure codes are stored. Conventional object stores may use pre-defined or static configuration settings to statically determine erasure code locations and distributions. The control may be exercised when an erasure code is stored. For example, conventional object storage systems may use static, pre-defined settings to distribute erasure codes across a collection of disks, servers, racks, or sites when a store operation is performed. Unfortunately, by relying on static, pre-defined configuration values that are only consulted at store time, these conventional systems may not consider the actual conditions that are present at the time an erasure code is to be stored. Additionally, by relying on static, pre-defined configuration values that are consulted only when a store operation is performed, conventional systems may not consider relationships between erasure codes, usage patterns of erasure codes, capacity considerations, or other factors that may affect the efficiency of an object storage system.

Thus, conventional systems may be unable to dynamically recognize a distribution pattern or plan that could optimize or improve performance of an object storage system. For example, usage patterns that result in hot spots of high loads on certain disks, servers, or sites may go unnoticed and thus may not be addressed by conventional systems leading to sub-optimal load balancing between devices in the object store. Load balancing is just one characteristic that may affect the operation of an object storage system. Other characteristics include capacity balancing, fault tolerance, locality of usage affecting read performance, associations between objects affecting read performance, and other factors.

An erasure code is a forward error correction (FEC) code for the binary erasure channel. The FEC facilitates transforming a message of k symbols into a longer message with n symbols such that the original message can be recovered from a subset of the n symbols, k and n being integers, n>k. The original message may be, for example, a file. The fraction r=k/n is called the code rate, and the fraction k'/k, where k' denotes the number of symbols required for recovery, is called the reception efficiency. Optimal erasure codes have the property that any k out of the n code word symbols are sufficient to recover the original message. Optimal codes may require extensive memory usage, CPU time, or other resources when n is large.

Erasure codes are described in coding theory. Coding theory is the study of the properties of codes and their fitness for a certain purpose (e.g., backing up files). Codes may be used for applications including, for example, data compression, cryptography, error-correction, and network coding. Coding theory involves data compression, which may also be referred to as source coding, and error correction, which may also be referred to as channel coding. Fountain codes are one type of erasure code.

Fountain codes have the property that a potentially limitless sequence of encoding symbols may be generated from a given set of source symbols in a manner that supports ideally recovering the original source symbols from any subset of the encoding symbols having a size equal to or larger than the number of source symbols. A fountain code may be optimal if the original k source symbols can be recovered from any k encoding symbols, k being an integer. Fountain codes may have efficient encoding and decoding algorithms that support recovering the original k source symbols from any k' of the encoding symbols with high probability, where k' is just slightly larger than k. A rateless erasure code is distinguished from an erasure code that exhibits a fixed code rate.

Object based storage systems may employ rateless erasure code technology (e.g., fountain codes) to provide a flexible level of data redundancy. The appropriate or even optimal level of data redundancy produced using a rateless erasure code system may depend, for example, on the number and type of devices available to the object based storage system. The actual level of redundancy achieved using a rateless erasure code system may depend, for example, on the difference between the number of readable redundancy blocks (e.g., erasure codes) written by the system and the number of redundancy blocks needed to reconstruct the original data. For example, if twenty redundancy blocks are written for an object and only eleven redundancy blocks are needed to reconstruct the object that was protected by generating and writing the redundancy blocks, then the object may be reconstructed even if nine of the redundancy blocks are damaged or otherwise unavailable.

Object based storage systems using rateless erasure code technology may facilitate storing erasure codes generated according to different redundancy policies (e.g., 7/3, 20/9, 20/2). A first type of redundancy policy may be referred to as an N/M redundancy policy where N total erasure codes are generated and the message can be regenerated using any N-M of the N total erasure codes, M and N being integers, M<N.

Since conditions in an object store can vary dynamically as, for example, devices experience heavier or lighter write loads, devices experience heavier or lighter read loads, erasure codes are added or deleted, erasure codes are accessed in patterns, or for other reasons, the operation of an object store may also vary dynamically. However, conventional systems may use pre-defined configuration settings to statically determine distribution, which may lead to sub-optimal or undesirable operations.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be

DETAILED DESCRIPTION

Example apparatus and methods account for dynamically changing conditions in an erasure code based object store. The object store may include multiple devices (e.g., disks) on which erasure codes can be stored. Conditions may vary dynamically as, for example, devices experience different write loads, as devices experience different read loads, as devices experience different read patterns, as erasure codes are added and deleted, and as devices are affected by operations. While conventional systems may use pre-defined configuration settings to statically determine distribution patterns, example apparatus and methods may dynamically identify distribution and redistribution parameters based on current conditions in a system. While conventional systems may consider conditions only when a store operation is requested, example apparatus and methods may evaluate conditions at different times and in response to different triggers.

Example apparatus and methods may identify distribution plans or redistribution plans based on factors including improving or optimizing load balancing, improving or optimizing capacity balancing, improving or optimizing fault tolerance, improving or optimizing read performance, or other factors. In one embodiment, the distribution plans or redistribution plans may be identified from user defined rules. In another embodiment, the distribution plans or redistribution plans may be identified from automated rules. Example apparatus and methods may provide or interact with a user interface that facilitates identifying a distribution plan or a redistribution plan.

Figure 1:
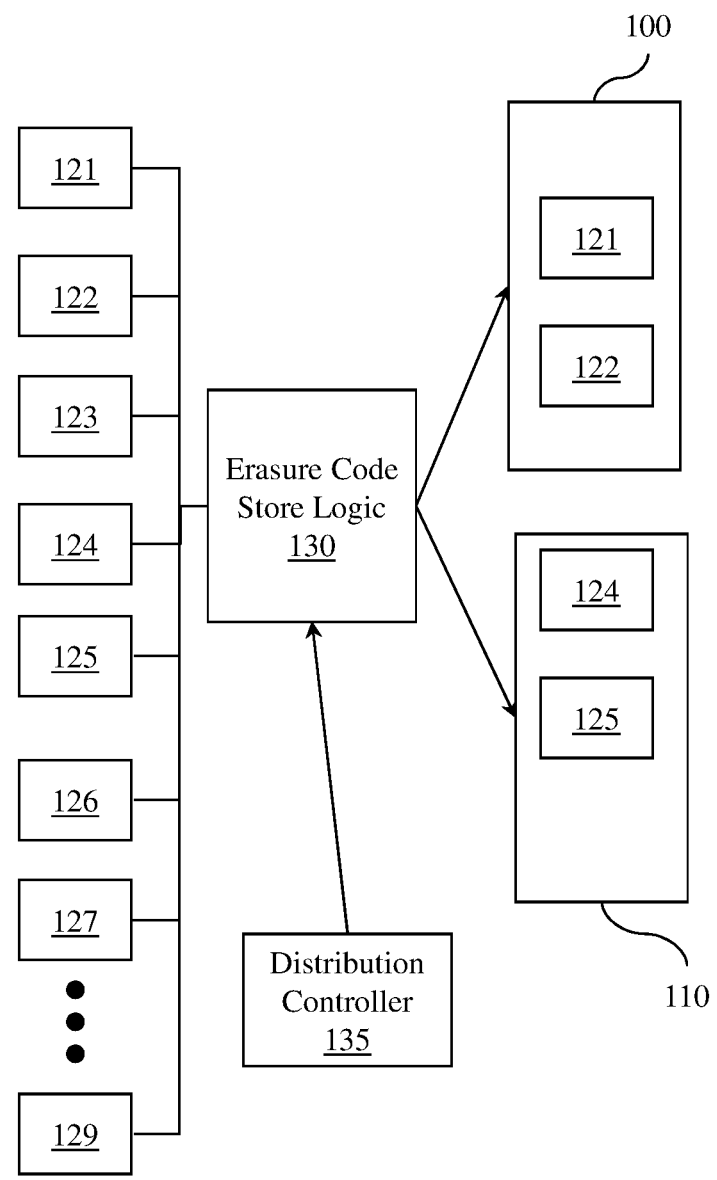
FIG. 1 illustrates an object store with a distribution controller.

FIG. 1 illustrates an object store that has devices 100 and 110 upon which erasure codes can be stored. Devices 100 and 110 may be, for example, disk drives. While two devices are illustrated, an object store may have more than two devices in which erasure codes can be stored. For example, an object storage system may have a plurality of disks located in a plurality of servers located in a plurality of racks located in a plurality of locations. An erasure code store logic 130 may be tasked with distributing erasure codes to the various locations available to the object store. In FIG. 1, the erasure code store logic 130 may be tasked with distributing erasure codes to either device 100 or device 110. How erasure code store logic 130 distributes the erasure codes may be controlled, at least in part, by distribution controller 135. Distribution controller 135 may have user-defined rules, automated rules, default rules, or other information upon which decisions to control how erasure code store logic 130 distributes erasure codes. Conventionally, distribution controller 135 may use static or pre-defined rules or information to control distribution.

FIG. 1 illustrates a set of erasure codes that includes erasure code 121 and erasure codes 122 through 129. The erasure codes may be distributed by erasure code store logic 130 as controlled by distribution controller 135. FIG. 1 illustrates erasure code 121 and erasure code 122 stored on device 100 and erasure code 124 and 125 stored on device 110. Other members of the erasure codes may be stored on other devices that are not illustrated. Initially, storing erasure codes 121 and 122 on device 100 and storing erasure codes 124 and 125 on devices 100 and 110 respectively may have been acceptable or optimal. However, over time, it may become apparent that an improved or optimized distribution of erasure codes may be possible. Conventional systems may miss the opportunity to produce the improved or optimized distribution.

Example apparatus and methods may identify a resource that is experiencing the lightest load. This may be referred to as the "coldest" available resource (e.g., disk, server, node, site). The load experienced by a resource may be associated with, for example, a disk IOPS load, a disk throughput load, a CPU load, a network bandwidth load, or other factor. Example apparatus and methods may then choose the "coldest" device to support a future erasure code operation. For example, when new erasure codes are presented to the object storage system for storage, the erasure codes may be sent to the device experiencing the lightest load. In different embodiments, generating the distribution plan may be event driven, periodic, user-driven, or triggered by other control factors. An event driven trigger may occur when, for example, a store operation is detected, when a load imbalance exceeds a threshold, or upon the occurrence of another event. Since the resource load may vary over time, and since the resource load may be sampled at different times (e.g., for each write, for every 100th write, hourly, daily), example apparatus and methods may be dynamically adaptive as a result of choosing the device with the lightest load at different periods of time. While the lightest load is described, example apparatus and methods may identify devices that are above a threshold and may identify devices that are below a threshold. A distribution plan may select one or more members of the devices that are below a threshold to handle future erasure code operations and may select one or more members of the devices that are above the threshold to not handle future erasure code operations. Example apparatus and methods may distribute future erasure code operations between the one or more devices that are below the threshold.

Figure 2:
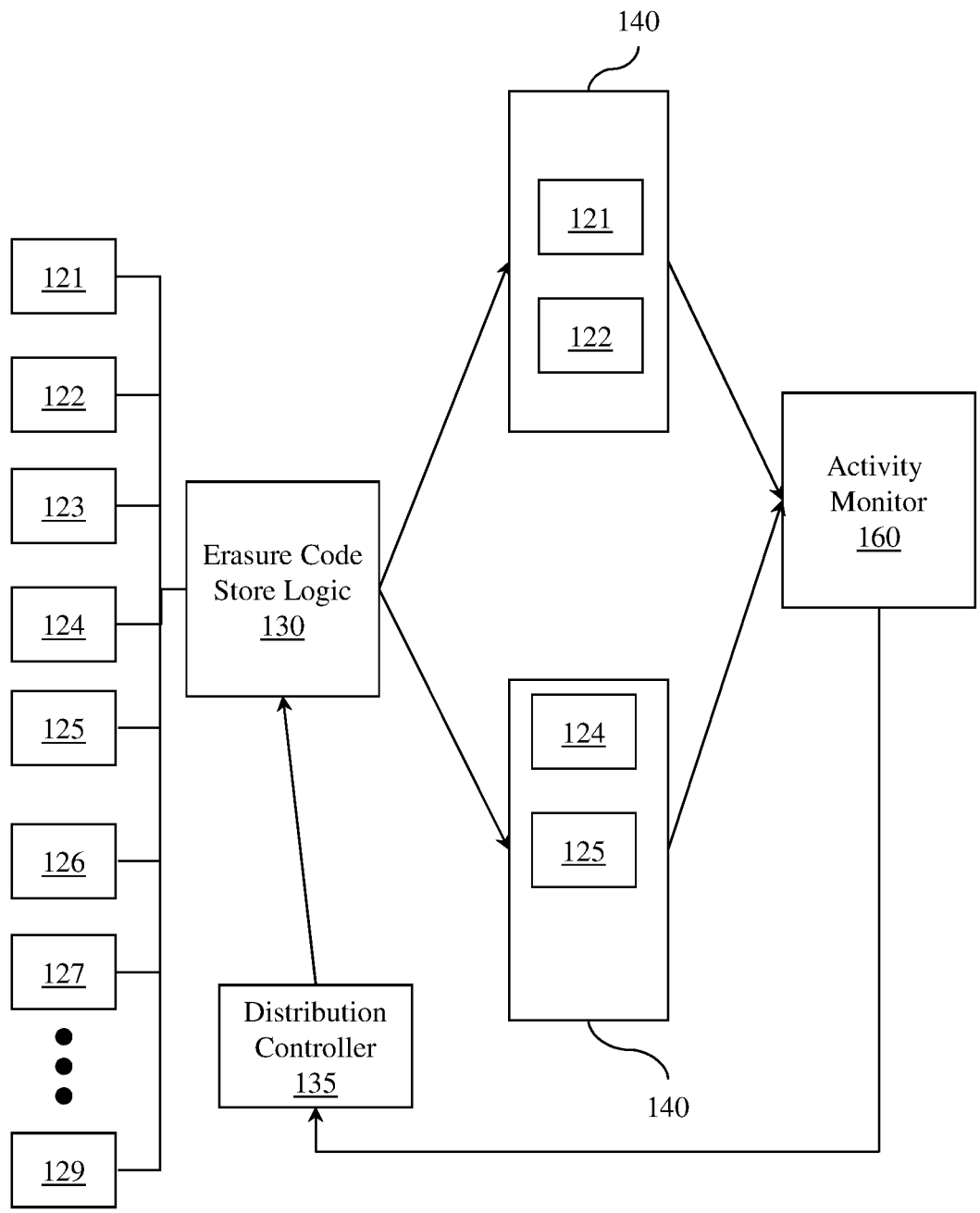
FIG. 2 illustrates an object store controlling erasure code storage based on feedback from an activity monitor.

FIG. 2 illustrates an activity monitor 160 providing feedback to the distribution controller 135. The activity monitor 160 may provide information concerning, for example, a disk IOPS load associated with a device, a disk throughput load associated with a device, a CPU load associated with a device, a network bandwidth load associated with a device, a read load, a write load, or other factor. In one embodiment, distribution controller 135 may use the data provided by the activity monitor 160 to identify devices that have a load that exceeds a threshold and may identify devices that have a load that does not exceed the threshold. In one embodiment, distribution controller 135 may use the data provided by the activity monitor 160 to rank devices from heaviest load to lightest load. Distribution controller 135 may then control erasure code store logic 130 to write erasure codes to devices based on the loads identified by the distribution controller 135. In one embodiment, erasure code store logic 130 may be controlled to write erasure codes to the device with the lightest load. In another embodiment, erasure code store logic 130 may be controlled to distribute erasure codes between devices that are below the load threshold. The distribution may be made according to different plans including, for example, a random distribution, a round robin distribution, a weighted distribution with the weight being a function of the load, or other plans.

Conventional object storage systems may not recognize associations between objects and therefore may not address locality of usage. For example, if a set of objects are components of a digital asset (e.g., frames in a video project) that are being used in a project workflow, the usage may produce a dynamic pattern across multiple sites or devices. Conventional object storage systems may not recognize or respond to the usage pattern. Example apparatus and methods may recognize the usage pattern and dynamically redistribute erasure codes to optimize or improve read performance based on locality of usage. For example, dynamic usage locality patterns (e.g., backup data being ingested at one site and then accessed at another site later) may be detected and responded to by dynamically redistributing erasure codes to optimize or improve the locality of access. By way of illustration, a backup data object can be very large and a typical access pattern may include a series of read operations over time. The series of read operations may access a large proportion of the object or even the entire object from a particular site. In an object storage system that is distributed over several disks, devices, sites, or otherwise, the read operations may be performed faster when the erasure codes to be read are located at the site at which the read operations are performed. Example apparatus and methods may monitor usage patterns and predict where future read operations are likely to be performed and then proactively move erasure codes to the predicted sites. For example, information may be acquired about a location that is reading a particular set of erasure codes. If the read activity exceeds a threshold, then the distribution controller 135 may control the erasure code store logic 130 to reposition an erasure code(s).

Figure 3:
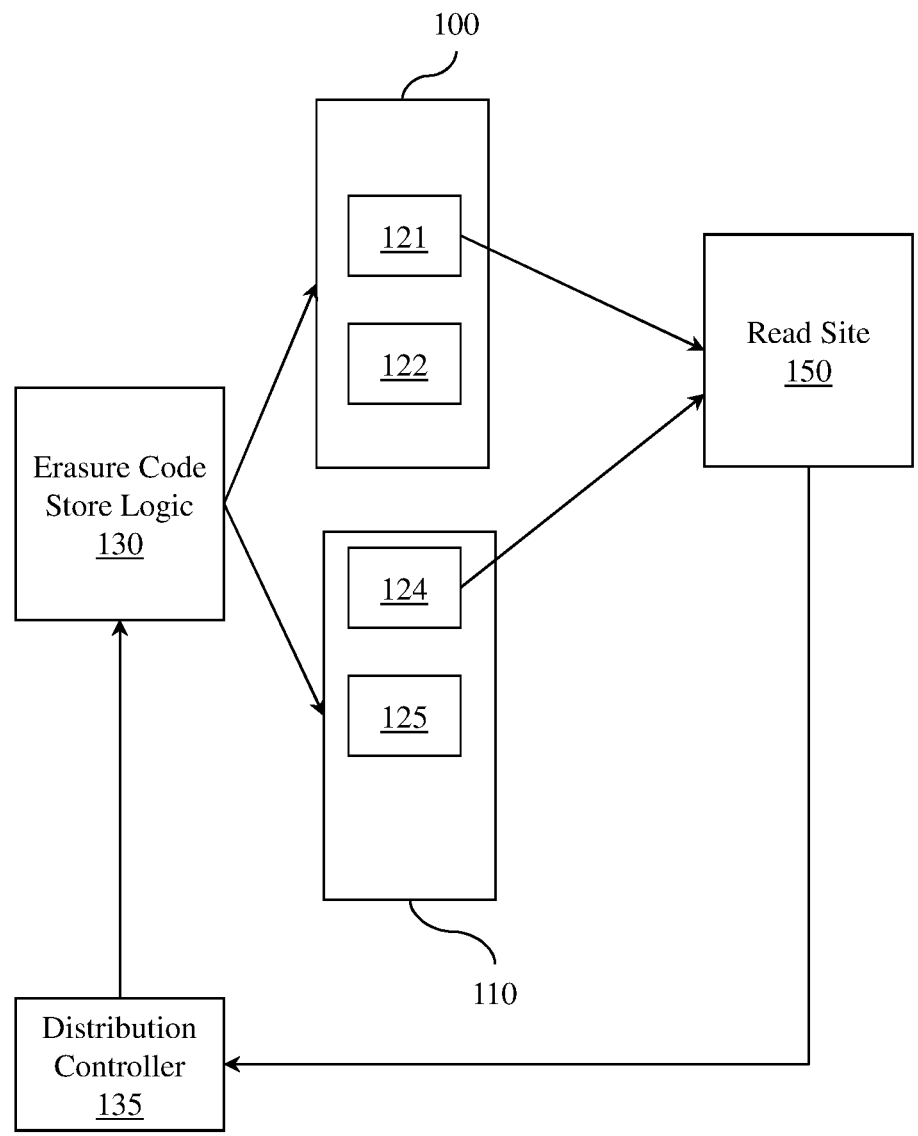
FIG. 3 illustrates an object store receiving feedback concerning the read activity experienced at a site(s).
Figure 4:
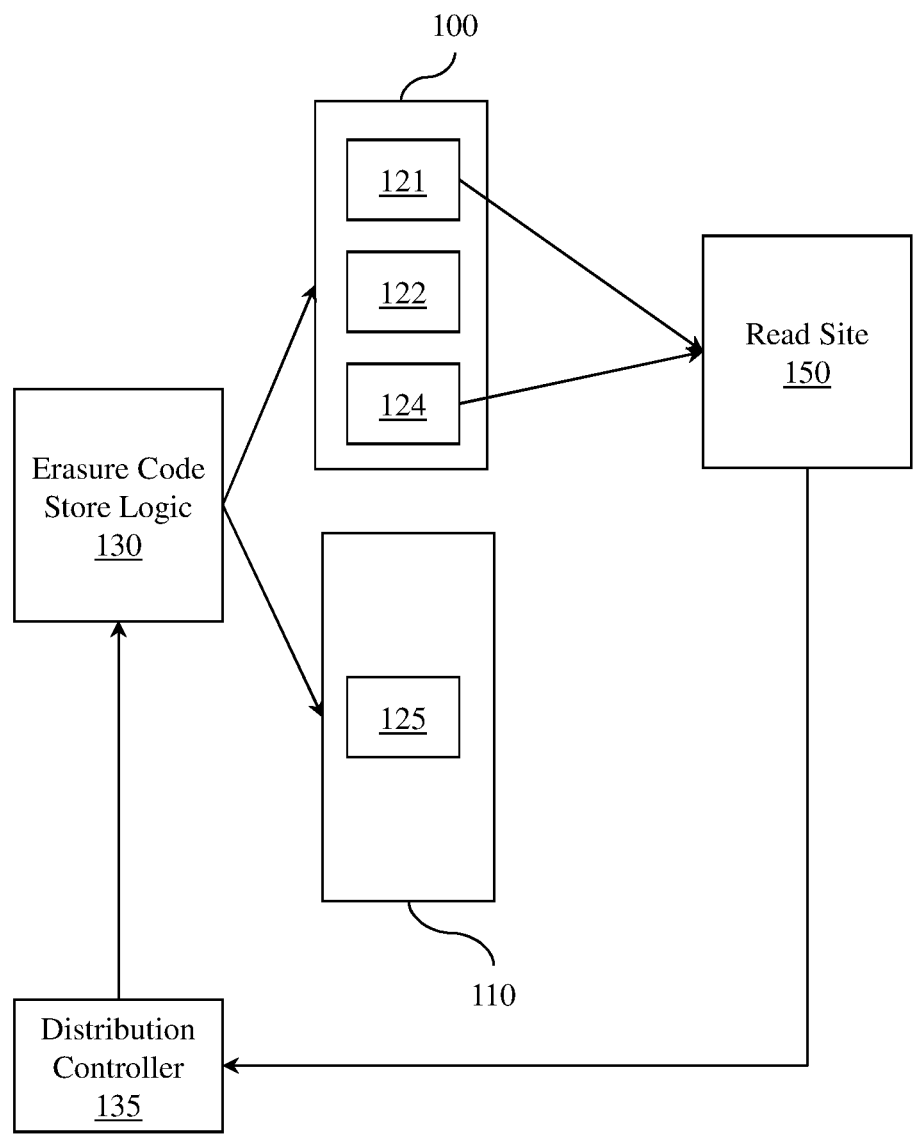
FIG. 4 illustrates re-distributing erasure codes in response to read activity feedback.

FIG. 3 illustrates distribution controller 135 receiving feedback concerning the read activity experienced at a site(s). For example, read site 150 may read erasure code 121 and erasure code 124. If this read activity exceeds a threshold, then erasure code 124 may be relocated. If read site 150 is associated with device 100, then erasure code 124 may be relocated from device 110 to device 100, as illustrated in FIG. 4.

Example apparatus and methods may also recognize associations (e.g., locality of usage) between objects and then redistribute erasure codes to improve or optimize read operations based on the associations. By way of illustration, if objects are related as components of a digital asset (e.g., frames of a video project) in a project workflow, then a typical access pattern may include performing a series of read operations from a given site over time encompassing a large percent or even all the frames. Example apparatus and methods may recognize this usage pattern and predict where future reads may be made based on the usage pattern. Erasure codes may then be redistributed to the sites that are predicted to experience the reads of those erasure codes. This may improve read time by positioning the erasure codes at or closer to a read site. However, redistribution may not happen automatically or in every case due, for example, to weighing the costs and benefits of redistribution. For example, moving erasure codes from one location to another may improve read performance but may degrade load balance, capacity balance, or fault tolerance. Thus, in one embodiment, a set of factors may be considered before producing a distribution plan, before producing a redistribution plan, or before redistributing in light of the redistribution plan.

Deleting an object may include deleting erasure codes associated with the object. When erasure codes are deleted from an object store, storage capacity in the object store may be released, which may in turn cause available capacity (e.g., unused space) to become imbalanced. Example apparatus and methods may recognize the capacity imbalance and redistribute erasure codes to address the imbalance. For example, erasure codes may be moved from a disk, device, rack, or site that has little spare capacity to another disk, device, rack, or site that has more capacity. The movement may be governed by a threshold that may weigh the benefit of moving erasure codes against the time, cost, or complexity of moving the erasure codes. Additionally and/or alternatively, erasure codes to be added to the object store may be distributed according to a plan that also addresses the imbalance. In different embodiments, redistribution may be event driven, periodic, user-driven, or triggered by other control factors. An event driven trigger may occur when, for example, a capacity imbalance exceeds a threshold.

Figure 5:
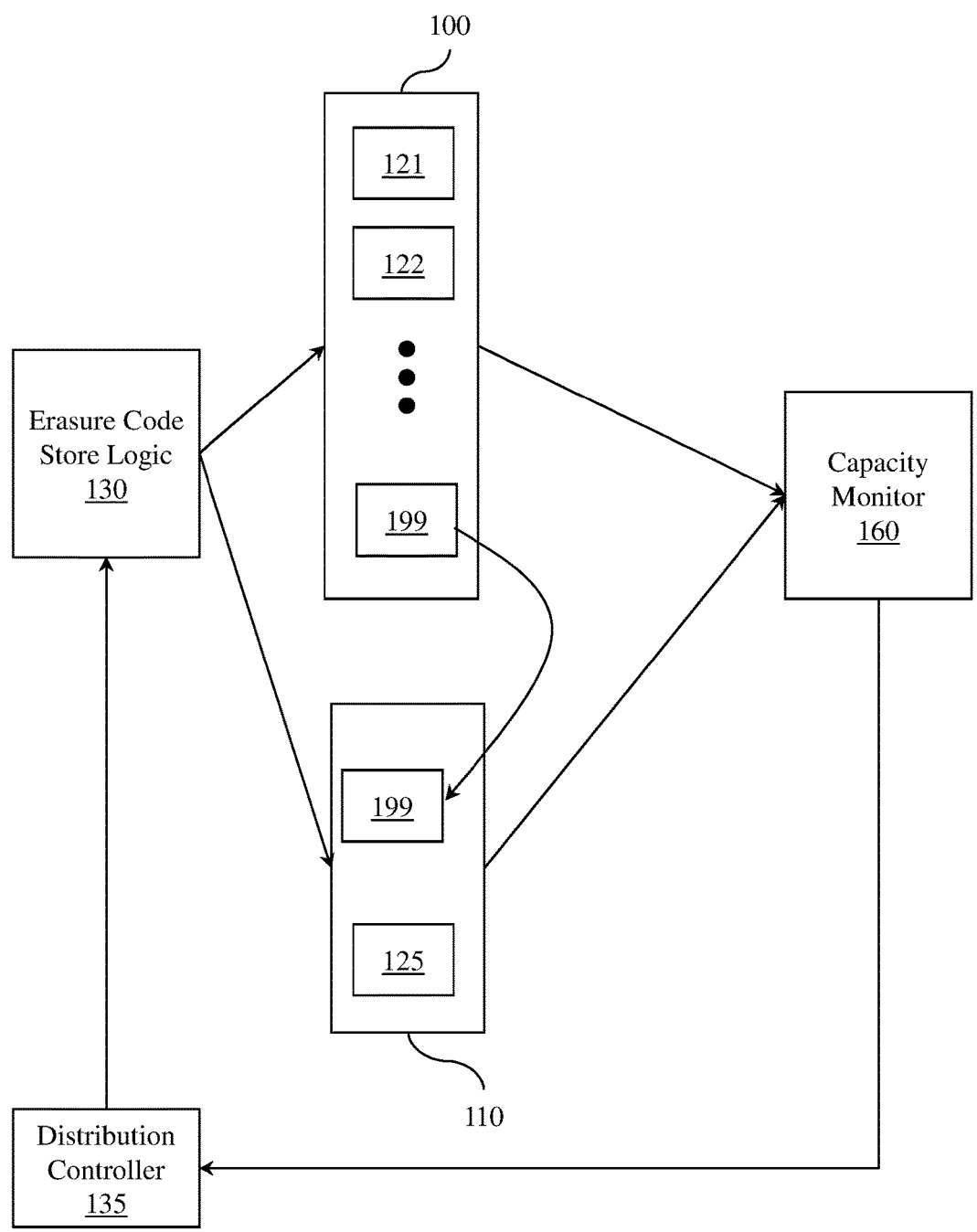
FIG. 5 illustrates an object store controlling erasure code re-distribution based on feedback from a capacity monitor.

FIG. 5 illustrates a capacity monitor 160 providing feedback about the capacity of device 100 and device 110 to distribution controller 135. In one embodiment, this capacity information may be used by distribution controller 135 to control erasure code store logic 130 to make future erasure code writes to whichever device has more available capacity. In one embodiment, the capacity information may be used by distribution controller 135 to control erasure code store logic 130 to relocate an erasure code from one device to another device. For example, erasure code 199 may be moved from device 100, which has less capacity, to device 110, which has more capacity.

Some portions of the detailed descriptions herein are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated. The physical manipulations create a concrete, tangible, useful, real-world result.

It has proven convenient at times, principally for reasons of common usage, to refer to these signals as bits, values, elements, symbols, characters, terms, or numbers. It should be borne in mind, however, that these and similar terms are to be associated with the appropriate physical quantities and are merely convenient labels applied to these quantities. Unless specifically stated otherwise, it is to be appreciated that throughout the description, terms including processing, computing, and determining refer to actions and processes of a computer system, logic, processor, or similar electronic device that manipulates and transforms data represented as physical (electronic) quantities.

Example methods may be better appreciated with reference to flow diagrams. For purposes of simplicity of explanation, the illustrated methodologies are shown and described as a series of blocks. However, it is to be appreciated that the methodologies are not limited by the order of the blocks, as some blocks can occur in different orders or concurrently with other blocks from that shown and described. Moreover, less than all the illustrated blocks may be required to implement an example methodology. Blocks may be combined or separated into multiple components. Furthermore, additional or alternative methodologies can employ additional, not illustrated blocks.

Figure 6:
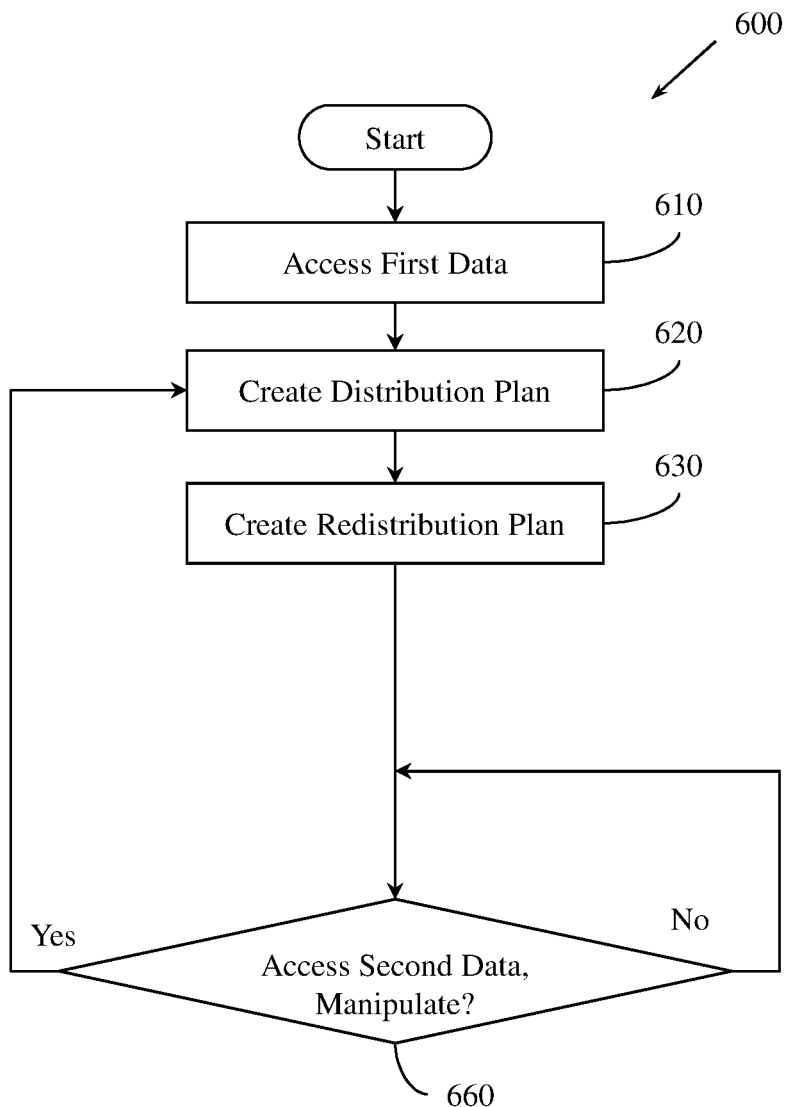
FIG. 6 illustrates an example method associated with dynamically controlling distribution of erasure codes in an object store.

FIG. 6 illustrates a method 600 associated with dynamically controlling distribution or redistribution of erasure codes in an object store that has two or more devices (e.g., disks) on which erasure codes can be stored. Method 600 includes, at 610, accessing a first data concerning an operating condition associated with the erasure code based object storage system. The two or more devices may include, for example, disks, solid state drives, tapes, servers, memories, or other computer-readable storage media.

Method 600 also includes, at 620, creating a distribution plan to control distribution of erasure codes to members of the two or more devices when the erasure codes are stored in the object storage system. The distribution plan is based, at least in part, on the first data. The operating condition for which the first data provides information may be, for example, a load balance measure associated with the object storage system. The load balance measure may rank the two or more devices in order according to load, may identify which of the two or more devices are operating above a load threshold, may identify which of the two or more devices are operating below a load threshold, or may provide other load information. The operating condition may also be, for example, a capacity balance measure associated with the object storage system. The capacity balance measure may rank the two or more devices in order according to capacity, may identify which of the two or more devices are operating above a capacity threshold, may identify which of the two or more devices are operating below a capacity threshold, or may provide other capacity information. The operating condition may also be, for example, a fault tolerance measure associated with the object storage system, a usage pattern measure associated with the object storage system, or other condition.

Method 600 may also include, at 630, creating a redistribution plan to control redistribution of erasure codes between members of the two or more devices after the erasure codes have been stored in the object storage system. The redistribution plan may be based, at least in part, on the first data. However, the redistribution plan may also be based on second data that is acquired after the erasure codes have been stored by the object storage device.

In one embodiment, the distribution plan or the redistribution plan may be created in response to receiving a request to store an erasure code in the object storage system. In one embodiment, the distribution plan may be created in light of a user-defined rule. The user-defined rule may specify criteria under which members of the two or more devices are to be selected to support future requests to store erasure codes. Similarly, the redistribution plan may be created in light of a user-defined rule. The user-defined rule may specify criteria under which an erasure code will be relocated from a source device in the object storage system to a target device in the object storage system. In one embodiment, an automated rule may be used instead of or in combination with the user-defined rule. The automated rule may also specify criteria under which members of the two or more devices are to be selected to support future requests to store erasure codes or criteria under which an erasure code will be relocated from a source device in the object storage system to a target device in the object storage system.

While individual measures may be considered, in one embodiment, the distribution plan depends, at least in part, on a first weighted combination of the load balance measure, the capacity balance measure, the fault tolerance measure, or the usage pattern measure. Similarly, the redistribution plan may depend, at least in part, on a second weighted combination of the load balance measure, the capacity balance measure, the fault tolerance measure, or the usage pattern measure. Using weighted combinations of operating conditions may facilitate mitigating unintended consequences of distribution plans or redistribution plans. For example, if weighted combinations are not employed, then curing a capacity imbalance may create a load balance issue.

Two or more devices may be suitable for receiving erasure codes. For example, two or more devices may have sufficient capacity and a low enough processing load to accept erasure codes. Thus, the distribution plan may control distribution of erasure codes to the eligible devices in the object storage system according to a schedule or plan. Devices may be selected using a round robin approach, a least recently used approach, a most recently used approach, a weighted round robin approach, or other approach. Similarly, two or more devices may be suitable for receiving relocated erasure codes. Thus, the redistribution plan may control distribution of erasure codes to the eligible devices according to a schedule or plan. A cost/benefit analysis may produce different results concerning storing erasure codes to different eligible devices and relocating erasure codes. Thus, in one embodiment, the thresholds for writing and relocating may be different and the plans or schedules for writing and relocating may be different.

Method 600 may also include, at 660, accessing a second data concerning the operating condition. The second data may be accessed after erasure codes have been stored and thus may be more up-to-date than the first data. The distribution plan or the redistribution plan may be manipulated (e.g., revised) based on the second data. The distribution plan or the redistribution plan may be manipulated upon determining that an operating condition exceeds a threshold. For example, the distribution plan or the redistribution plan may be manipulated if the load balance measure exceeds a load balance threshold, if the capacity balance measure exceeds a capacity balance threshold, if the fault tolerance measure exceeds a fault tolerance threshold, or if the usage pattern measure exceeds a usage pattern threshold. Once again, a combination of thresholds may be considered. If the second data indicates that the distribution plan or the redistribution plan is to be manipulated, processing may return to 620. Otherwise, method 600 may continue to access second data and re-evaluate whether the distribution plan or redistribution plan is to be manipulated.

Figure 7:
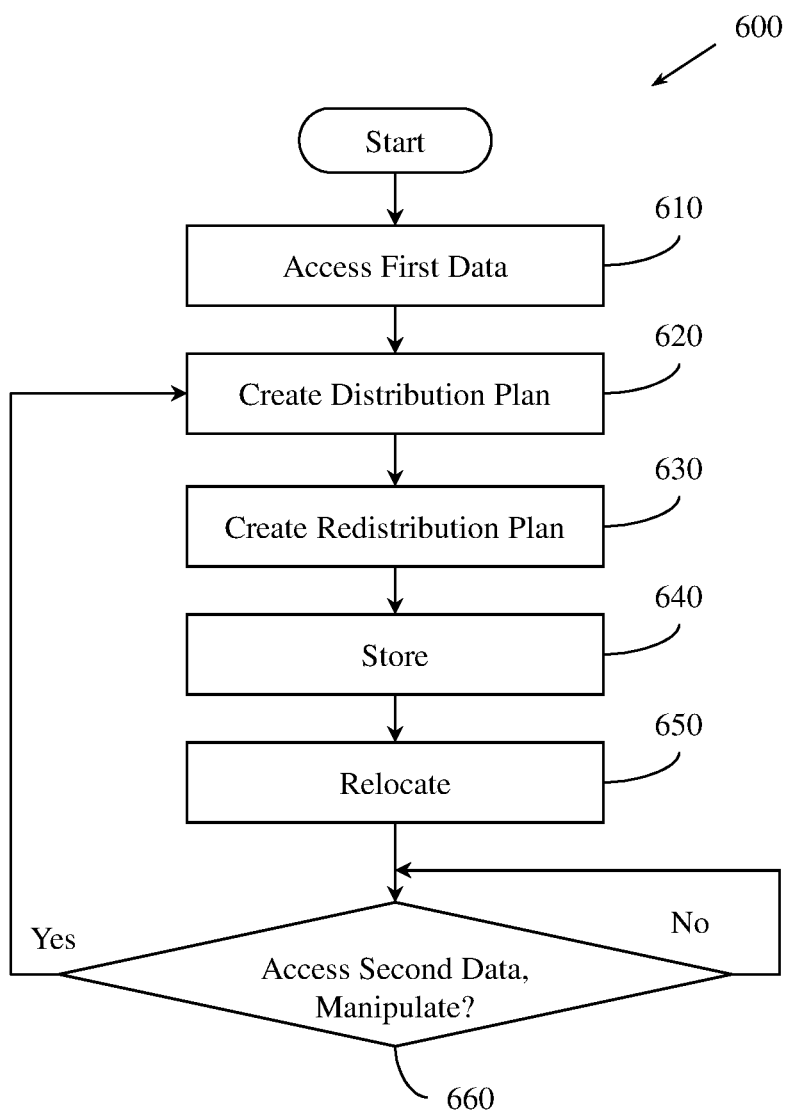
FIG. 7 illustrates an example method associated with dynamically controlling distribution of erasure codes in an object store.

FIG. 7 illustrates another embodiment of method 600. This embodiment of method 600 also includes, at 640, controlling an erasure code to be stored in the object storage system at a location determined by the distribution plan. Controlling the erasure code to be stored in the object storage system at a specific location may include, for example, making a function call, providing an erasure code to a shared memory, providing an erasure code to a communication interface, writing the erasure code to a known location, providing an address of the erasure code to a function, process, or circuit, providing a pointer to the erasure code to a function, process, or circuit, or other action.

This embodiment of method 600 may also include, at 650, controlling an erasure code to be relocated from a first device in the object storage system to a second device in the object store system. The erasure code may be relocated according to the redistribution plan. Causing the erasure code to be relocated may include, for example, making a function call, providing the erasure code to a shared memory, providing the erasure code to a communication interface, writing the erasure code to a known location, providing an address of the erasure code to a function, process, or circuit, providing a pointer to the erasure code to a function, process, or circuit, or other action.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and other similar terms, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

ASIC: application specific integrated circuit.
CD: compact disk.
CD-R: CD recordable.
CD-RW: CD rewriteable.
CPU: central processing unit.
DVD: digital versatile disk and/or digital video disk.
HTTP: hypertext transfer protocol.
I/O: input/output.
IOPS: input output operations per second.
LAN: local area network.
RAM: random access memory.
DRAM: dynamic RAM.
SRAM: synchronous RAM.
RAID: redundant array of independent disks.
ROM: read only memory.
PROM: programmable ROM.
SSD: solid state drive
SAN: storage area network.
USB: universal serial bus.
WAN: wide area network.

"Computer component", as used herein, refers to a computer-related entity (e.g., hardware, firmware, software in execution, combinations thereof). Computer components may include, for example, a process running on a processor, a processor, an object, an executable, a thread of execution, and a computer. A computer component(s) may reside within a process and/or thread. A computer component may be localized on one computer and/or may be distributed between multiple computers.

"Computer-readable storage medium", as used herein, refers to a non-transitory medium that stores instructions and/or data. A computer-readable medium may take forms, including, but not limited to, non-volatile media, and volatile media. Non-volatile media may include, for example, optical disks, magnetic disks, and other disks. Volatile media may include, for example, semiconductor memories, dynamic memory, and other memories. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Data store", as used herein, refers to a physical and/or logical entity that can store data. A data store may be, for example, a database, a table, a file, a data structure (e.g. a list, a queue, a heap, a tree) a memory, a register, or other repository. In different examples, a data store may reside in one logical and/or physical entity and/or may be distributed between two or more logical and/or physical entities.

"Logic", as used herein, includes but is not limited to hardware, firmware, software in execution on a machine, and/or combinations of each to perform a function(s) or an action(s), and/or to cause a function or action from another logic, method, and/or system. Logic may include, for example, a software controlled microprocessor, a discrete logic (e.g., ASIC), an analog circuit, a digital circuit, a programmed logic device, or a memory device containing instructions. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, or logical communications may be sent or received. An operable connection may include a physical interface, an electrical interface, or a data interface. An operable connection may include differing combinations of interfaces or connections sufficient to allow operable control. For example, two entities can be operably connected to communicate signals to each other directly or through one or more intermediate entities (e.g., processor, operating system, logic, software). Logical or physical communication channels can be used to create an operable connection.

"Signal", as used herein, includes but is not limited to, electrical signals, optical signals, analog signals, digital signals, data, computer instructions, processor instructions, messages, a bit, or a bit stream, that can be received, transmitted and/or detected.

"Software", as used herein, includes but is not limited to, one or more executable instructions that cause a computer, processor, or other electronic device to perform functions, actions and/or behave in a desired manner. "Software" does not refer to stored instructions being claimed as stored instructions per se (e.g., a program listing). The instructions may be embodied in various forms including routines, algorithms, modules, methods, threads, or programs including separate applications or code from dynamically linked libraries.

"User", as used herein, includes but is not limited to one or more persons, software, logics, applications, computers or other devices, or combinations of these.

Figure 8:
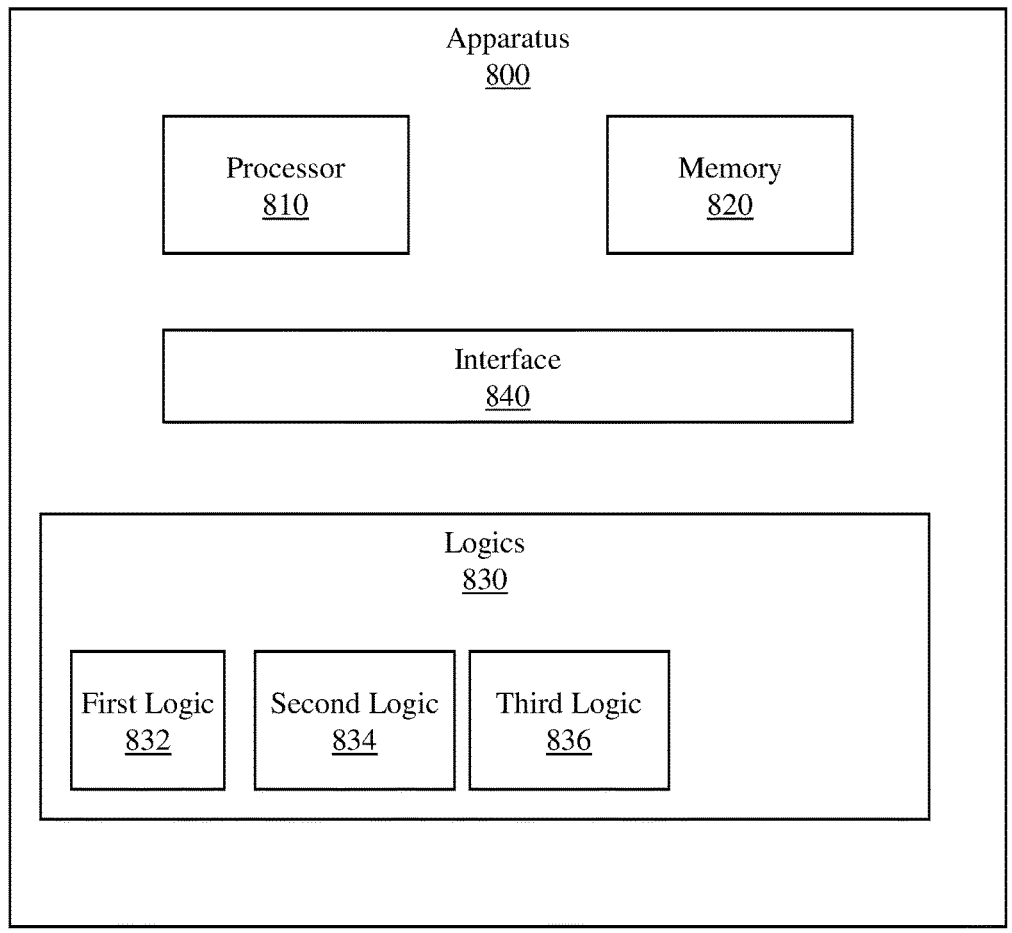
FIG. 8 illustrates an example apparatus configured to dynamically control distribution of erasure codes in an object store.

FIG. 8 illustrates an apparatus 800 that includes a processor 810, a memory 820, and a set 830 of logics that is connected to the processor 810 and memory 820 by an interface 840. In one embodiment, the apparatus 800 may be an object storage system. In one embodiment, the apparatus 800 may be operably connected to or in data communication with an object storage system. Recall that an object storage system performs object-based storage using a storage architecture that manages data as objects instead of, for example, as files. "Object", as used herein, refers to the usage of object in computer science. From one point of view, an object may be considered to be a location in a physical memory having a value and referenced by an identifier.

In one embodiment, the set of logics 830 may control the location of an erasure code in an erasure code based object store that includes a plurality of storage apparatus. The plurality of storage apparatus may include, for example, disks, solid state drives, tapes, memories, or other computer-readable storage media.

The set 830 of logics may include a first logic 832 that controls the location of the erasure code in the object store based on processing loads experienced by two or more members of the plurality of storage apparatus. In one embodiment, the first logic 832 controls requests to store erasure codes in the object store to be handled by the member of the plurality of storage apparatus having the lowest processing load.

The apparatus 800 may also include a second logic 834 that controls the location of the erasure code in the object store based on storage capacities present in two or more members of the plurality of storage apparatus. In one embodiment, the second logic 834 controls requests to store erasure codes in the object store to be handled by the member of the plurality of storage apparatus having the most available storage capacity. The second logic 834 may also control erasure codes to be moved from the member of the plurality of storage apparatus having the least available storage capacity to the member of the plurality of storage apparatus having the most available storage capacity.

The apparatus 800 may also include a third logic 836 that controls the location of the erasure code in the object store based on usage patterns experienced by two or more members of the plurality of storage apparatus. The usage pattern may concern, for example, a relationship between an ingest site and an accessing site, a relationship between objects or erasure codes, or other relationships. In one embodiment, the third logic 836 controls erasure codes to be moved from a member of the plurality of storage apparatus located at a site that accesses the erasure code the least to a member of the plurality of storage apparatus located at a site that accesses the erasure code the most.

While the first logic 832 may select an apparatus having the lightest processing load, while the second logic 834 may select an apparatus having the most available storage capacity, and while the third logic 836 may select apparatus based on maximum and minimum usage patterns, other selection criteria may be employed. By way of illustration, the first logic 832 may control requests to store erasure codes in the object store to be handled by members of the plurality of storage apparatus having processing loads less than a processing load threshold. The processing load threshold may be an absolute number (e.g., a certain percentage of CPU cycles or I/O cycles available), a relative number (e.g., processing load is in lower third of all measured processing loads), or a combined threshold (e.g., at least a certain percentage of CPU cycles available and in lower half of all measured processing loads). When more than one member of the plurality of storage apparatus qualifies to handle requests, the various members may be selected according to a schedule (e.g., round robin, most recently used first, least recently used first), randomly, or according to other criteria. By way of further illustration, the second logic 834 may control requests to store erasure codes in the object store to be handled by members of the plurality of storage apparatus having a storage capacity greater than a storage capacity threshold. Once again, the storage capacity threshold may be an absolute threshold, a relative threshold, or a combined threshold and multiple eligible devices may be selected according to different plans. Additionally, the second logic 834 may control erasure codes to be moved from members of the plurality of storage apparatus having a storage capacity less than the storage capacity threshold to members of the plurality of storage apparatus having a storage capacity greater than the storage capacity threshold. In different embodiments, the capacity threshold to control storage requests may be the same or different than the capacity threshold to control relocation. By way of further illustration, the third logic 836 may control erasure codes to be moved from members of the plurality of storage apparatus located at sites that access the erasure codes less than a usage pattern threshold to members of the plurality of storage apparatus located at sites that access the erasure codes more than the usage pattern threshold. Once again, the usage pattern threshold may be an absolute threshold, a relative threshold, or a combined threshold and multiple eligible apparatus may be selected according to different plans or schedules.

Figure 9:
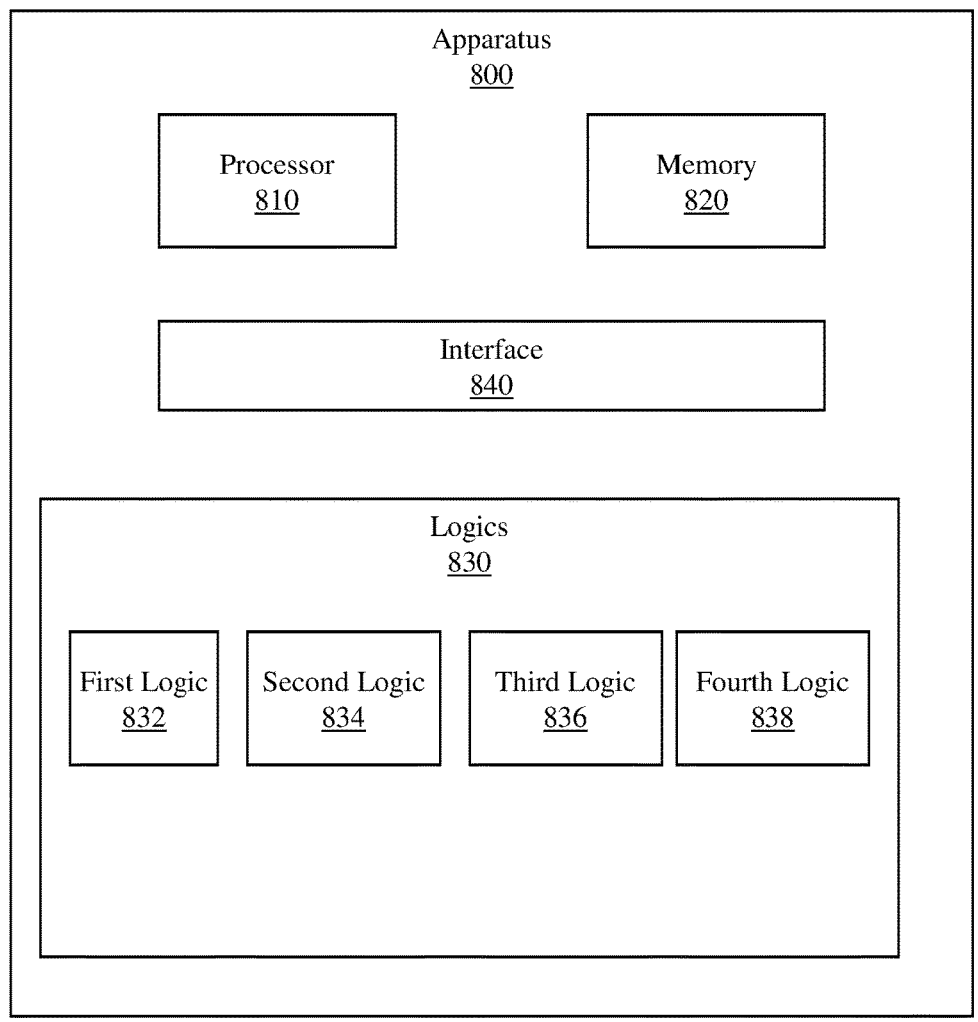
FIG. 9 illustrates an example apparatus configured to dynamically control distribution of erasure codes in an object store.

FIG. 9 illustrates another embodiment of apparatus 800. This embodiment includes a fourth logic 838. The fourth logic 838 may control the first logic 832, the second logic 834, and the third logic 836 based on a combined utility function. The combined utility function may weigh the processing loads, the storage capacities, and the usage patterns for members of the plurality of storage apparatus before allowing the first logic 832, the second logic 834, or the third logic 836 to control distribution or relocation. For example, even though a usage pattern indicates that read performance may be improved by relocating erasure codes from one site to another site, processing load considerations at the site and capacity considerations at that site may prevent the erasure codes from being relocated.

Figure 10:
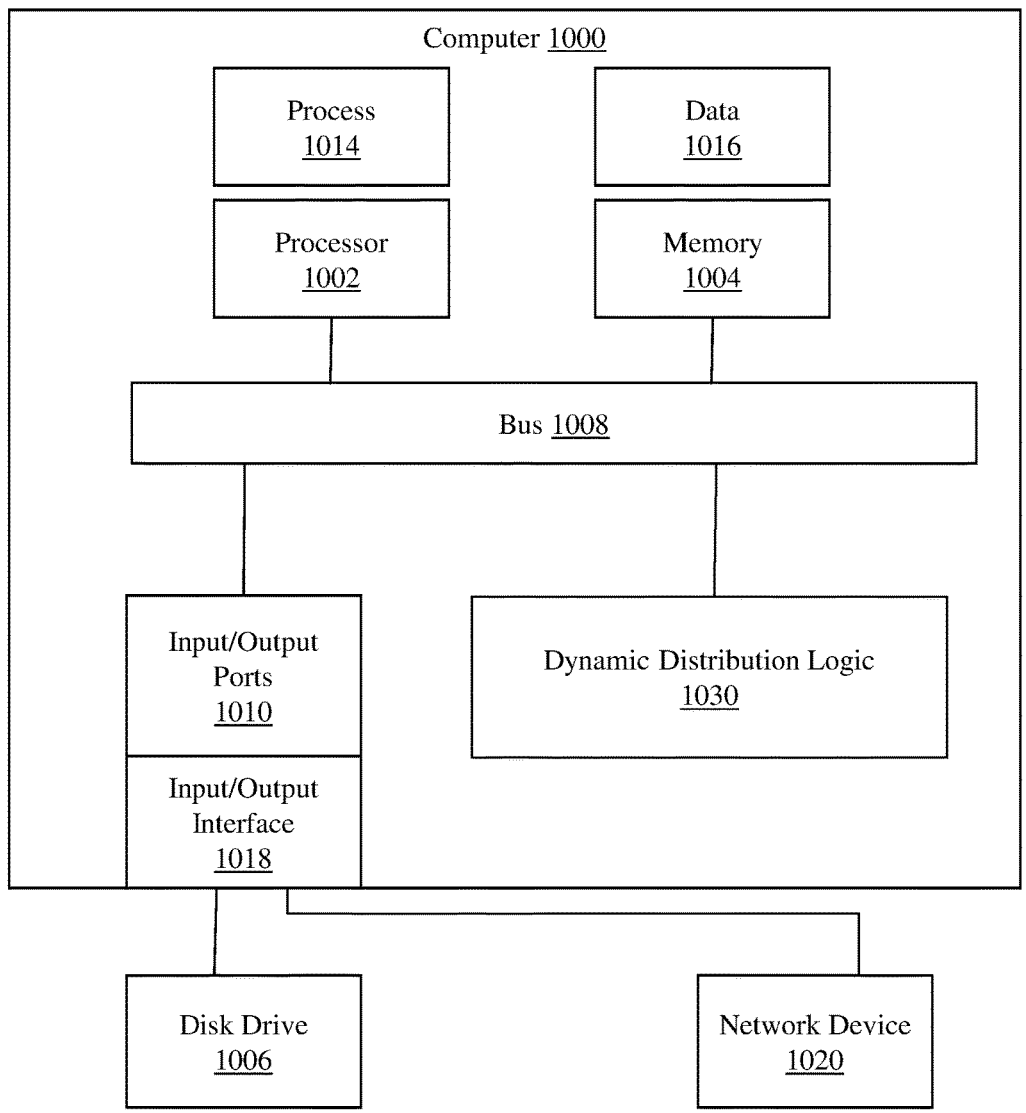
FIG. 10 illustrates an example apparatus associated with dynamically controlling distribution of erasure codes in an object store.

FIG. 10 illustrates an example computing device in which example systems and methods described herein, and equivalents, may operate. The example computing device may be a computer 1000 that includes a processor 1002, a memory 1004, and input/output ports 1010 operably connected by a bus 1008. In one example, the computer 1000 may include a dynamic distribution logic 1030 that controls the distribution or redistribution of erasure codes between devices available to an object store. In different examples, the logic 1030 may be implemented in hardware, software, firmware, and/or combinations thereof. While the logic 1030 is illustrated as a hardware component attached to the bus 1008, it is to be appreciated that in one example, the logic 1030 could be implemented in the processor 1002.

In one embodiment, logic 1030 may provide means (e.g., hardware, software, firmware, circuit) for identifying where to store erasure codes in an object store. The identifying may be based on a processing load, a storage capacity, a fault tolerance, or a usage pattern associated with an apparatus in the object store at a first time. For example, a location whose processing load is too high may not receive new erasure codes while a location whose processing load is not too high may receive erasure codes. What constitutes "too high" and "too low" may be, for example, an absolute criteria (e.g., processing load greater than fifty percent of CPU utilization), or a relative criteria (e.g., processing load in lower half of all measured processing loads). In one embodiment, the means for identifying where to store erasure codes is configured to optimize a weighted value computed from the processing load, the storage capacity, the fault tolerance, or the usage pattern at a time when an erasure code is stored in the object store. The weighted value may be computed to prevent causing one problem (e.g., unacceptable fault tolerance) by addressing another problem (e.g., load based distribution). For example, if erasure code distribution was governed solely by processing load concerns, then all of the erasure codes for an object may end up stored at a single site experiencing a lowest processing load. However, having all erasure codes for an object at a single site, or even worse, on a single device, may produce an unacceptable fault tolerance.

Logic 1030 may also provide means (e.g., hardware, software, firmware, circuit) for identifying where to relocate erasure codes in an object store. Identifying where to relocate erasure codes may be based on a processing load, a storage capacity, a fault tolerance level, or a usage pattern associated with an apparatus in the object store at a second, later time (e.g., after erasure codes have already been stored). In one embodiment, the means for identifying where to relocate erasure codes may be configured to optimize a weighted value computed from the processing load, the storage capacity, the fault tolerance, or the usage pattern at a time after the erasure code is stored in the object store. Once again, the weighted measure may be configured to prevent creating a new problem by mitigating an existing problem. In different embodiments, the weighted measures for initial distribution and subsequent relocation may be the same or different.

The means associated with logic 1030 may be implemented, for example, as an ASIC that implements the functionality of apparatus described herein. The means may also be implemented as computer executable instructions that implement the functionality of methods described herein and that are presented to computer 1000 as data 1016 that are temporarily stored in memory 1004 and then executed by processor 1002.

Generally describing an example configuration of the computer 1000, the processor 1002 may be a variety of various processors including dual microprocessor and other multi-processor architectures. A memory 1004 may include volatile memory and/or non-volatile memory. Non-volatile memory may include, for example, ROM, PROM, and other memory. Volatile memory may include, for example, RAM, SRAM, DRAM, and other memory.

A disk 1006 may be operably connected to the computer 1000 via, for example, an input/output interface (e.g., card, device) 1018 and an input/output port 1010. The disk 1006 may be, for example, a magnetic disk drive, a solid state disk drive, a floppy disk drive, a tape drive, a Zip drive, a flash memory card, a memory stick, or other device. Furthermore, the disk 1006 may be a CD-ROM drive, a CD-R drive, a CD-RW drive, a DVD ROM drive, a Blu-Ray drive, an HD-DVD drive, or other device. The memory 1004 can store a process 1014 and/or a data 1016, for example. The disk 1006 and/or the memory 1004 can store an operating system that controls and allocates resources of the computer 1000.

The bus 1008 may be a single internal bus interconnect architecture and/or other bus or mesh architectures. While a single bus is illustrated, it is to be appreciated that the computer 1000 may communicate with various devices, logics, and peripherals using other busses (e.g., PCIE, 1394, USB, Ethernet). The bus 1008 can be types including, for example, a memory bus, a memory controller, a peripheral bus, an external bus, a crossbar switch, and/or a local bus.

The computer 1000 may interact with input/output devices via the i/o interfaces 1018 and the input/output ports 1010. Input/output devices may be, for example, a keyboard, a microphone, a pointing and selection device, cameras, video cards, displays, the disk 1006, the network devices 1020, and other devices. The input/output ports 1010 may include, for example, serial ports, parallel ports, and USB ports.

The computer 1000 can operate in a network environment and thus may be connected to the network devices 1020 via the i/o interfaces 1018, and/or the i/o ports 1010. Through the network devices 1020, the computer 1000 may interact with a network. Through the network, the computer 1000 may be logically connected to remote computers. Networks with which the computer 1000 may interact include, but are not limited to, a LAN, a WAN, and other networks.

While example systems, methods, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and other embodiments described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. An apparatus that dynamically controls erasure code distribution in an object store, the apparatus comprising:
a processor;
a memory;
a set of circuits that control the location of an erasure code in an erasure code based object store, where the object store includes two or more devices on which an erasure code can be stored; and
an interface that connects the processor, the memory, and the set of circuits;
the set of circuits comprising:
a first circuit that accesses a first data concerning an operating condition associated with the object store, and that recognizes an association between a plurality of objects associated with an erasure code to be stored in the object store;
a second circuit that identifies a usage pattern associated with the plurality of objects, where the usage pattern is based, at least in part, on the association, where the usage pattern concerns a relationship between an ingest site and an accessing site, and a relationship between the plurality of objects or erasure codes to be stored in the object store;
a third circuit that generates a prediction of where, in the object store, a read operation will be performed on the plurality of objects, based, at least in part, on the usage pattern; and a fourth circuit that creates a distribution plan to control distribution of erasure codes to members of the two or more devices when the erasure codes are stored in the object store, where the distribution plan is based, at least in part, on the first data and the prediction.

2. The apparatus of claim 1, where the fourth circuit controls an erasure code to be stored in the object store at a location determined by the distribution plan.

3. The apparatus of claim 2, comprising a fifth circuit that creates a redistribution plan to control redistribution of erasure codes between members of the two or more devices after the erasure codes have been stored in the object store, where the redistribution plan is based, at least in part, on the first data or the prediction.

4. The apparatus of claim 3, where the redistribution plan is a random approach redistribution plan, or a round-robin approach redistribution plan.

5. The apparatus of claim 4, where the fifth circuit controls an erasure code to be relocated from a first device in the object store to a second device in the object store according to the redistribution plan.

6. The apparatus of claim 5, where the fourth circuit creates the distribution plan, or the fifth circuit creates the redistribution plan, in response to receiving a request to store an erasure code in the object store.

7. The apparatus of claim 6, comprising a sixth circuit that accesses a second data concerning the operating condition and selectively manipulates the distribution plan or the redistribution plan based on the second data, where the second data is more up-to-date than the first data.

8. The apparatus of claim 7, where the sixth circuit selectively manipulates the distribution plan or the redistribution plan according to a user-defined schedule.

9. The apparatus of claim 8, where the sixth circuit selectively manipulates the distribution plan or the redistribution plan upon determining that:
a load balance measure exceeds a load balance threshold, where the load balance measure includes ranking the two or more devices in order according to load, identifying which of the two or more devices are operating above a load threshold, or identifying which of the two or more devices are operating below a threshold, and at least one of:
a capacity balance measure exceeds a capacity balance threshold, or
a fault tolerance measure exceeds a fault tolerance threshold.

10. The apparatus of claim 3:
where the fourth circuit creates the distribution plan by identifying, based on a first user-defined rule, one or more members of the two or more devices that will support future requests to store erasure codes; and
where the fifth circuit creates the redistribution plan by identifying, based on a second user-defined rule, a source device in the object store from which a first erasure code will be relocated and a target device in the object store to which the first erasure code will be relocated.

11. The apparatus of claim 3:
where the fourth circuit creates the distribution plan by identifying, based on a first automated rule, one or more members of the two or more devices that will support future request to store erasure codes; and
where the fifth circuit creates the redistribution plan by identifying, based on a second automated rule, a source device in the object store from which a first erasure code will be relocated and a target device in the object store to which the first erasure code will be relocated.

12. The apparatus of claim 3:
where the distribution plan depends, at least in part, on a first weighted combination of two or more of, a load balance measure, a capacity balance measure, a fault tolerance measure, and the usage pattern; and
where the redistribution plan depends, at least in part, on a second weighted combination of two or more of, the load balance measure, the capacity balance measure, the fault tolerance measure, and the usage pattern.

13. The apparatus of claim 3:
where the fourth circuit controls distribution of erasure codes to two or more different eligible devices in the object store according to a first plan or a schedule; and
where the fifth circuit controls redistribution of erasure codes to two or more different eligible devices in the object store according to a second plan or schedule.

* * * * *